(12) United States Patent
Lohman (10) Patent No.: US 8,800,787 B2
(45) Date of Patent: Aug. 12, 2014

(54) COVER FOR ELECTRONIC EQUIPMENT COMPRISING FASTENING DEVICE

(75) Inventor: Bertil Lohman, Djupdalsvägen (SE)

(73) Assignee: Clamco Invest AB, Sollentuna (SE)

( * ) Notice: Subject to any disclaimer, the term of this patent is extended or adjusted under 35 U.S.C. 154(b) by 288 days.

(21) Appl. No.: 13/503,377

(22) PCT Filed: Oct. 21, 2010

(86) PCT No.: PCT/SE2010/051141
§ 371 (c)(1),
(2), (4) Date: May 23, 2012

(87) PCT Pub. No.: WO2011/049527
PCT Pub. Date: Apr. 28, 2011

(65) Prior Publication Data
US 2012/0242202 A1 Sep. 27, 2012

(30) Foreign Application Priority Data
Oct. 23, 2009 (SE) ...................................... 0950787

(51) Int. Cl.
H05K 7/14 (2006.01)
(52) U.S. Cl.
USPC ..................... 211/26; 312/223.3; 361/679.58; 361/829

(58) Field of Classification Search
USPC ........... 211/26, 26.2, 182, 190, 192; 174/535, 174/541; 312/223.1–223.3, 223.6; 361/829, 361/679.58, 724
See application file for complete search history.

(56) References Cited

U.S. PATENT DOCUMENTS

| | | | |
|---|---|---|---|
| 6,269,959 B1 * | 8/2001 | Haworth | 211/26 |
| 6,398,041 B1 * | 6/2002 | Abbott | 211/26 |
| 6,926,378 B2 * | 8/2005 | Greenwald et al. | 312/334.4 |
| 7,950,531 B2 * | 5/2011 | Morris | 211/26 |
| 2004/0120106 A1 | 6/2004 | Searby et al. | |
| 2009/0020330 A1 | 1/2009 | Kitamura et al. | |

OTHER PUBLICATIONS

International Search Report, dated Jan. 28, 2011, from corresponding PCT application.

* cited by examiner

Primary Examiner — Korie H Chan
(74) Attorney, Agent, or Firm — Young & Thompson

(57) ABSTRACT

Cover of 19-inch rack type for electronic equipment, wherein the cover includes a fastening device including a front face, oriented facing out from the rack system, a rear side, two opposing side faces, as well as a bottom and a top face. The fastening device is fixed to the cover using a first fastening element, extending out from the side face of the cover, and fastened to the stand using a second fastening element so the rear face of the fastening device is oriented facing the stand, whereby the cover can be fixed to the stand. The fastening device includes a cavity between the front face and the rear face, including an opening and arranged with a gripping element for fingers, so that a user can insert one or several fingers through the opening and pull the cover out from its place in the rack system using the gripping element.

12 Claims, 5 Drawing Sheets

COVER FOR ELECTRONIC EQUIPMENT COMPRISING FASTENING DEVICE

The present invention relates to a cover for electronic equipment intended for mounting in a rack system of 19 inch type. The invention relates especially to such a cover comprising a fastening device for fastening the cover to a stand in such a rack system.

Electronic equipment is typically arranged in the form of individual units, comprising a plurality of electronic components. It is common for a number of units to be arranged close to each other in stands. A commonly used form factor for such rack systems is the European 19 inch standard.

When mounting such units, in many cases having considerable weight, in rack systems, there is a need to be able to quickly and simply install and remove units in and from the rack system, and to move units between different places in a rack system.

At the same time, electronic components are generally sensitive to electrostatic discharge (ESD). When for example a user with a different electric potential than the cover touches the latter, the electric discharge between user and cover can disturb the operation of the components, and even destroy some components. Such discharge can also result when a cover, which is isolated from a stand in the system, during insertion into the rack system comes into direct contact with the stand.

Therefore, it is desirable that each such unit with electronic equipment is arranged so that the touched part is well grounded, so that voltage discharges does not negatively affect the components arranged in the unit.

Previously, it has been proposed to fasten a cover against a stand using a fastening device which is integrated with the front panel of the cover, alternatively to use separate fastening angle brackets. In both these cases, as a rule the front panel and the fastening bracket have respective surface treatments, for example lacquer or an anodized surface. Therefore, there is very poor or no electric contact between fastening device and stand, in turn resulting in uncertain or non-existing ground connection of the cover, and therefore ESD-related problems.

Moreover, both these solutions lead to difficulties for a user to pull out and handle the cover during installation in, removal from, and moving around in the rack system. To solve this problem, it has been proposed to mount projecting handles on the front side of the cover. Such handles have proven to be difficult to design with good ergonomics, and also result in that the visibility for information displays, controls etc. on the cover front side is deteriorated at oblique viewing angles, which is not desirable.

Thus, it would be desirable to achieve a fastening device for a cover which achieves both sufficient electric contacting to guarantee good ESD properties, as well as sufficient strength and ergonomics in order to be used as grips for a user when handling the cover.

The present invention solves the above described problems.

Thus, the invention relates to a cover for electronic equipment, which cover is intended for mounting in a rack system, following the standard for 19 inch racks, comprising a stand, wherein the cover comprises a fastening device comprising a front face, which is arranged to be oriented facing out from the rack system when the fastening device is mounted on the cover and the cover is mounted in the rack system, a rear face arranged opposite to the front face, two opposing side faces, as well as a bottom and a top face, wherein the fastening device is arranged to be fixedly connected to the cover at one of its side faces, extending a certain distance out from the side face of the cover, and fastened to the stand so that the rear face of the fastening device is arranged oriented facing towards the stand, whereby the cover can be fixed to the stand, and is characterised in that the fastening device comprises a cavity, arranged between the front face and the rear face and comprising an opening, and in that the cavity is arranged with gripping means for one or several fingers, so that a user can insert one or several fingers through the opening and pull the cover out from its place in the rack system using the gripping means once the fastening device has been unfastened from the stand.

In the following, the invention will be described in detail, with reference to exemplifying embodiments of the invention and to the enclosed drawings, where:

FIG. 2b is an exploded perspective view of the cover of FIG. 2a;

FIG. 3a is a perspective view of the fastening device of FIG. 2a;

FIG. 4a is an exploded perspective view of the fastening device of FIG. 2a; and

In all figures, the same reference numerals denote the same or corresponding parts.

Figure 1:
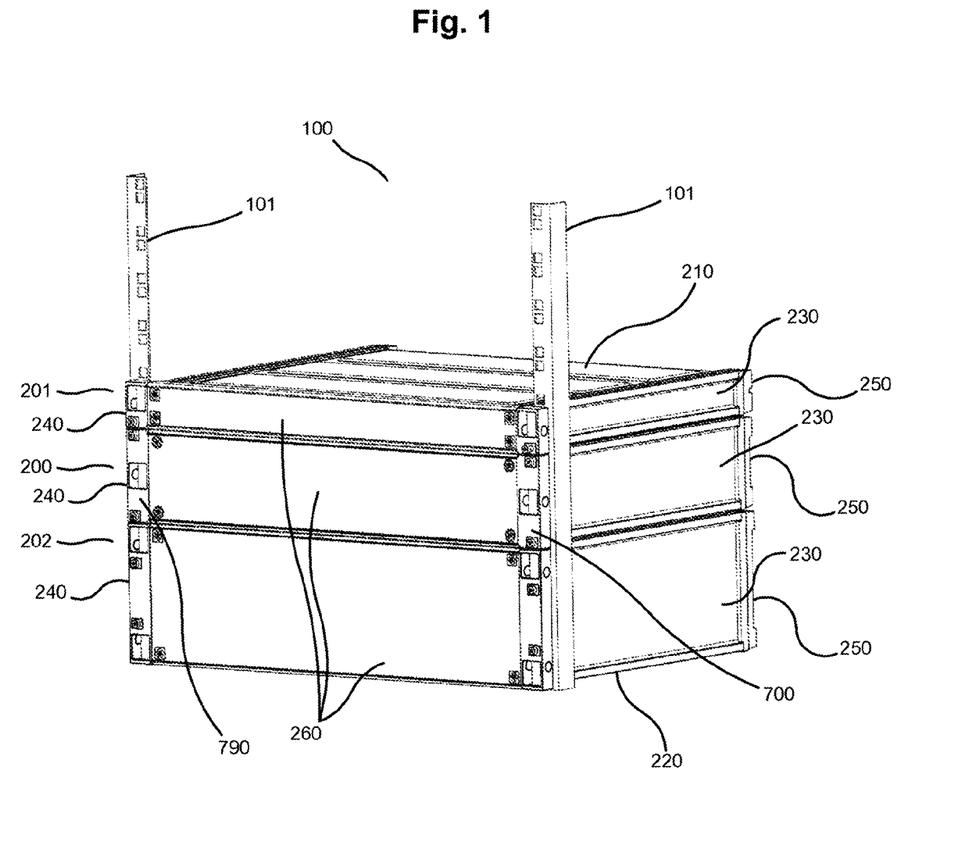
FIG. 1 is a perspective view of three different covers mounted in a stand of 19 inch type.

FIG. 1 shows a rack system 100 of 19 inch standard, comprising a stand 101 in which three different covers 200, 201, 202 for electronic equipment are mounted.

Figure 2A:
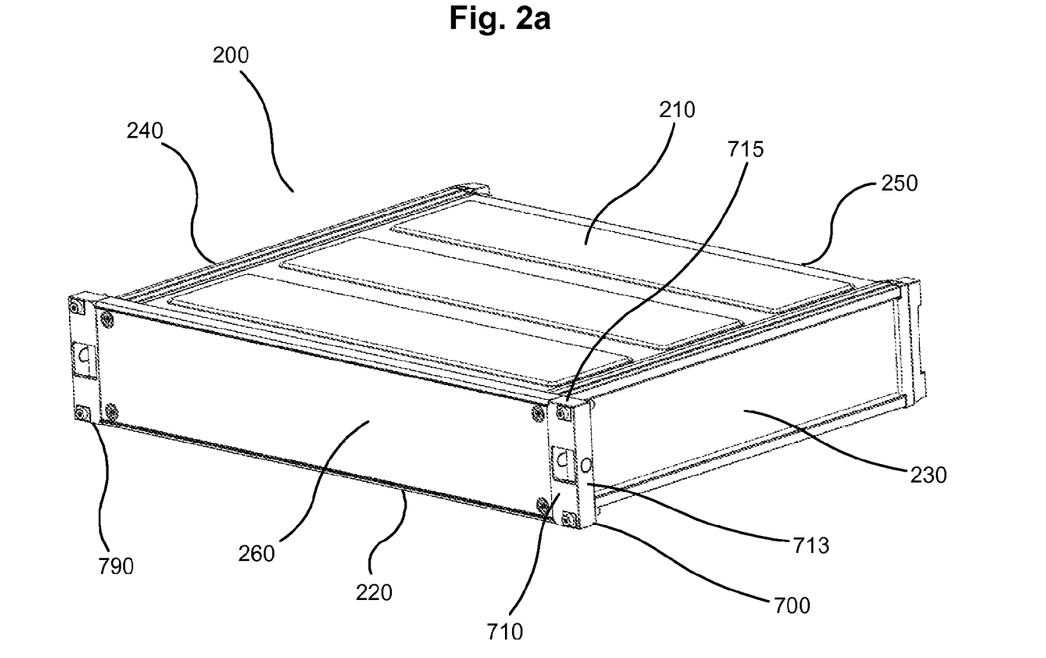
FIG. 2a is a perspective view of a cover with a fastening device.
Figure 2B:
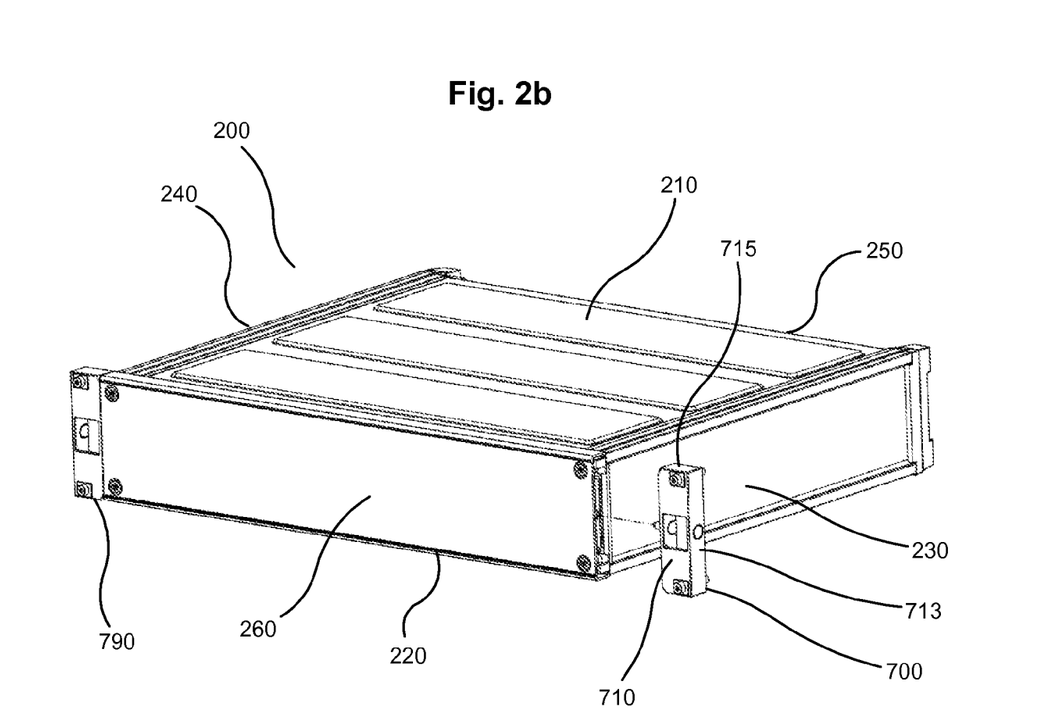

The middle one 200 of the covers is illustrated in closer detail in FIGS. 2a and 2b. The cover 200, which is made of an electrically conducting material, preferably metal, comprises a top face 210, along which a top panel extends; a bottom face 220, along which a bottom panel extends; side faces 230, 240, along which respective side panels extend; a rear face 250, along which a rear panel extends; and a front face 260, along which a front panel extends.

At the face 230 there is a fastening device 700 mounted. Preferably, the fastening device is fastened at the face 230 so that it extends out from the face, essentially in parallel with the front face 260. It may be fastened in different ways, such as at the end of the front panel, at the side face of the side panel, and so forth, as long as the fastening point at the cover can offer good electric contacting and good mechanical strength in accordance with what is described below. On the opposite face 240, there is a corresponding, mirrored fastening device 790 mounted.

FIGS. 3a-3d illustrate the fastening device 700 in closer detail. The FIGS. 4a-4b illustrate the same fastening device 700 exploded.

The fastening device 700, which preferably is essentially shaped as a rectangular parallelepiped, comprises a front face 710, which is arranged to be oriented facing out from the rack system 100, in the same direction as the front face 260, when the fastening device is mounted on the cover 200 and the cover is mounted against the stand 101 in the rack system. The fastening device further comprises a back face 711, arranged opposite to the front face 710; two opposing side faces 712, 713; as well as a bottom face 714 and an opposing top face 715. The fastening device is arranged to be fastened against the cover at the face 230 of the cover, and thereby extending some ways out from the side of the cover. Furthermore, the fastening device is arranged to be fastened against the stand using fastening means, so that the fastening device in a fastened state is arranged so that its rear face faces towards the stand. Such a fastening will thus also result in that the cover as such will, via the fastening device, be fixed to the stand.

According to the invention, the fastening device 700 comprises a first through hole 720 for fastening the fastening device to the side 230 of the cover 200, which through hole extends from the one side face 712 to the other side face 713. Through this first hole, a fastening means 720*a* can be inserted and used for fastening the fastening device against the cover. It is preferred that the fastening means is in the form of a screw that can be inserted into the hole 721 from the side face 713 and be screwed into a corresponding hole in the side 230 of the cover with internal threads. The latter hole can be designed in a way which is conventional as such in order to engage with the said screw, as long as good electric contacting is achieved between the cover 200 and the screw.

Moreover, according to the invention the fastening device 700 comprises a second through hole 721 for fastening the fastening device to the stand 101, which hole extends from the front face 710 to the back face 711. In a corresponding way as for the first hole 720, through this second hole another fastening means 721*a* can be inserted and used for fastening the fastening device to the stand 101. It is preferred that also this second fastening means is in the form of a screw which then can be inserted into the hole 721 from the front face 710, and be screwed into a corresponding internally threaded hole in the front side of the cover 101. This hole may also be arranged in a way which is conventional as such, as long as good electric contacting between the stand and the screw is achieved.

The exemplifying embodiment illustrated in the figures illustrates a fastening means 700 with a first through hole 720 and two second through holes 721. However, it is realized that also other numbers of first and second through holes, respectively, can occur, depending on the dimensions of the cover 200, the geometric positioning of the fastening points on cover as well as on stand 101, strength requirements, etc. Examples comprise two or several first holes, only one or more than two second holes, and so forth.

A fastening device 700 according to the above yields a number of advantages.

Firstly, it becomes possible to arrange the fastening device 700 with a thickness between front face 710 and rear face 711 which is sufficient to allow the existence of a through hole 720 between the two side faces 712, 713, as opposed to a design as a thin sheet metal. Moreover, the fastening devices may be designed so that the electric contacting between the cover 200 and the stand 101, via the fastening device 700, becomes good and reliable, even when the cover is moved around in the rack system 100. Namely, good electric contacting can be achieved between the respective fastening means 720*a*, 721*a* and the fastening device 700, by suitable choices of fastening geometries, even during repeated demounting and mounting of the cover in the rack system. Furthermore, good repeatable contacting between the respective fastening means 720*a*, 721*a* and the cover 200 and stand 101, respectively, is similarly achievable by suitable choices of fastening means. Different alternatives for how this may be achieved are described in closer detail below. Since the fastening device is made from an electrically conducting material, this in turn will result in that the electric contacting between cover and stand can be made repeatable and reliable.

When an in relation to the cover 200*a* electrically charged user touches the cover, such good electric contacting between cover and stand will result in that the electric voltage discharge efficiently can be conducted away from the cover, via the fastening device 700 to the stand 101. Here, it is assumed that the stand is grounded in a conventional way.

When the same user directly touches the fastening device 700, the voltage discharge will be conducted away directly from the fastening device to the stand 101.

When the cover 200 is inserted into a certain position in the rack system 100, so that the fastening device 700 of the cover for the first time since a removal comes into direct contact with the stand 101, any arisen discharges will be conducted away via the fastening device 700 to the cover. This conduction will take place via the fastening means 721*a*, alternatively via the surface of the fastening device, depending on how the cover is inserted into its position against the stand and depending on the surface treatment of the fastening device and stand, respectively.

Thus, such voltage discharges will not negatively affect the existing components in the cover 200. The same is true regarding voltage discharges originating for example from the connection of shielding connectors to the cover, which similarly can be conducted via the cover and on to the fastening device 700 and then to the stand 101.

Secondly, the fastening device 700, including fastening means 720*a*, 721*a*, together with the mirrored fastening device 790, be arranged so that the fastening devices 700, 790 constitute a robust handle on each side of the front face of the cover 200. This achieves a simple way for a user of the cover to quickly be able to pull it out from its position in the rack system 100, put it down on the floor, a table or the like for maintenance, etc., and to thereafter be able to easily again lift the cover up for remounting into the rack system. In this respect, conventional solutions offer limited ergonomics. If for example the front plate is extended towards its sides and serves as fastening device against the stand, the user can grip around the projecting parts of the front plate. Such projecting parts are difficult to design with good grip ergonomics, and such a front plate has also a limited strength. A filled cover can many times have a substantial weight. If separate handles are arranged on the front, they must have relatively large dimensions in order to be able to offer adequate ergonomics, with resulting sight-related problems as described above.

Thirdly, the cover 200 can be delivered in a package in which the fastening devices 700, 790 are not mounted on the cover. As a consequence, the outer dimensions or the package, and also the risk for transport damages to the cover, can be decreased.

According to a preferred embodiment, the fastening device 700 comprises a distance means 730 of electrically conducting metal material, arranged to run through the second through hole 721. The distance means has a through hole 731, which is arranged to run in parallel with and within the second hole when the distance means 730 is mounted in the second hole. In other words, the distance means constitutes a constriction of the second through hole, through which constriction the fastening means 721*a* can be inserted in order to fasten the fastening device to the stand 101.

Furthermore, the distance means comprises a shoulder 732, arranged to abut against a corresponding support surface 740 of the fastening device when the distance means is mounted in the second through hole, so that the shoulder prevents the distance means to be displaced in a direction towards the rear face 711 of the fastening device.

Since the distance means 730 can be designed in a material and with a geometry that optimize the contacting between the fastening means 721*a* and the distance means, the fastening device 700 can be more freely designed with maintained contacting properties. Thus, it is preferred that the distance means is made of stainless steel, and also that the fastening means is a screw, the head of which is arranged to act against the outside of the shoulder 732, the surface of which outside preferably is arranged a certain distance outside of the front face 710 of the fastening device 700 when the distance means is mounted in the fastening device. Since the distance means can be designed with greater strength than the screw, this way the screw can be allowed to be tightened properly, with good contacting as a result, without risking damages to the fastening device.

Moreover, the use of a distance means 730 according to the above results in that the fastening means 721*a* can be mounted without risking surface damages to the front face 710 of the fastening device 700. In case the fastening means for example is a screw, it can be fastened, using suitable tools, and be tightened against the surface of the distance means without coming into direct contact with the surface of the front face 710. Thus, the fastening device can be provided with a desired surface treatment, without having to take into consideration the electric contacting between the surface of the front face 710 and the fastening means.

According to a preferred embodiment, the distance means 730 is designed so that its end surface 733 facing away from the shoulder 732 is parallel with, and arranged in alignment with, alternatively extending a certain distance past, the rear face 711 of the fastening device 700 when the distance means is mounted in the second hole 721. This will result in that the fastening means 721*a* can press the distance means and the stand 101 together with great force, and therefore good electric contacting both between fastening means and distance means as well as between distance means and stand, without risking deformations in the material in the body of the fastening device 700 as such.

Furthermore, it is preferred that the distance means 730 is arranged with external, sharp grooves 734 or corresponding engagement means, that during mounting of the distance means in the second through hole 721 are arranged to engage, and thereby give rise to good electric contacting, with the material in the fastening device 700 at the inside of the second hole. According to a preferred embodiment, the engagement means 734 are arranged to engage with the material of the fastening device by deforming said material to a certain extent, so that a permanent connection between the distance means and the rest of the fastening device results preferably, the distance means is pressed into the second through hole during assembly.

According to a preferred embodiment, the fastening means 721*a* is a screw for fastening the fastening device 700 to the stand 101, and the distance means 730 is arranged with internal threads for engagement with the screw. It is preferred that the screw is of so-called "non-losable" (Swedish "oförlorbar") type, in other words that it is arranged so that it during unscrewing from a mounted position in a first step can be unscrewed so that the fastening between stand and fastening device is loosened, whereby the screw is retained loosely in the hole 731, and that the screw thereafter, in a second step, can be unscrewed a bit further after which it can be completely removed. For example, this can be accomplished by the interior threads only being arranged along part of the distance means close to the shoulder 732, and that the screw comprises a lengthwise waist having two surrounding, threaded sections. Alternatively, the screw may comprise a section having external threads at its end facing away from the head, and the distance means may comprise two separate sections displaying interior threads.

The use of non-losable fastening screws results in simplified mounting and demounting of the cover 200 in the rack system 100. It has proven difficult to arrange a conventional fastening device of the thin sheet metal type with non-losable fastening screws in a satisfactory way.

Hence, with a construction according to the above described, good contacting is achieved between, in turn, the fastening means 700 and the distance means 730; between the distance means and the fastening means 721*a*; as well as between the fastening means and the stand 101. In other words, good and reliable electric contacting between the fastening device and the stand is achieved.

To achieve adequate electric contacting between the fastening means 720*a* and the fastening device 700, it is preferred that the first through hole 720 comprises a countersink 720*b* in which the fastening means is arranged to be received and against which a screw head or the corresponding of the fastening means is arranged to be pressed. The surface of the countersink 720*b* is free from any surface treatment of the fastening means, whereby adequate contacting can be guaranteed without the manufacturing becoming complicated and without such surface treatment of the fastening device risking damages when the fastening means is tightened against the surface in question.

In this way, good electric contacting between the fastening device 700 and the cover 200 is also achieved. Thereby, good electric contacting is achieved via, in turn, the cover 200, the fastening means 720*a*, the fastening device 700, the distance means 730, the fastening means 721*a* and the stand 101. Consequently, electrostatic discharges can efficiently be conducted away from the cover without disturbing the operation of the components that are arranged inside the cover.

Figure 3A:
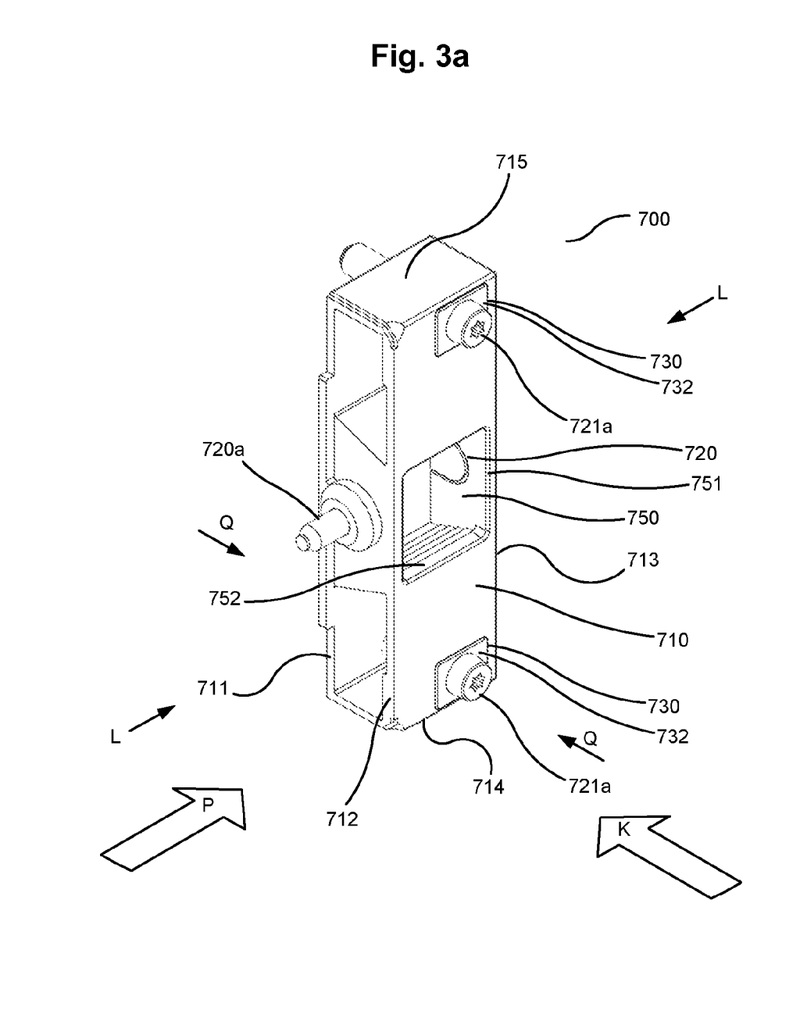
Figure 3B:
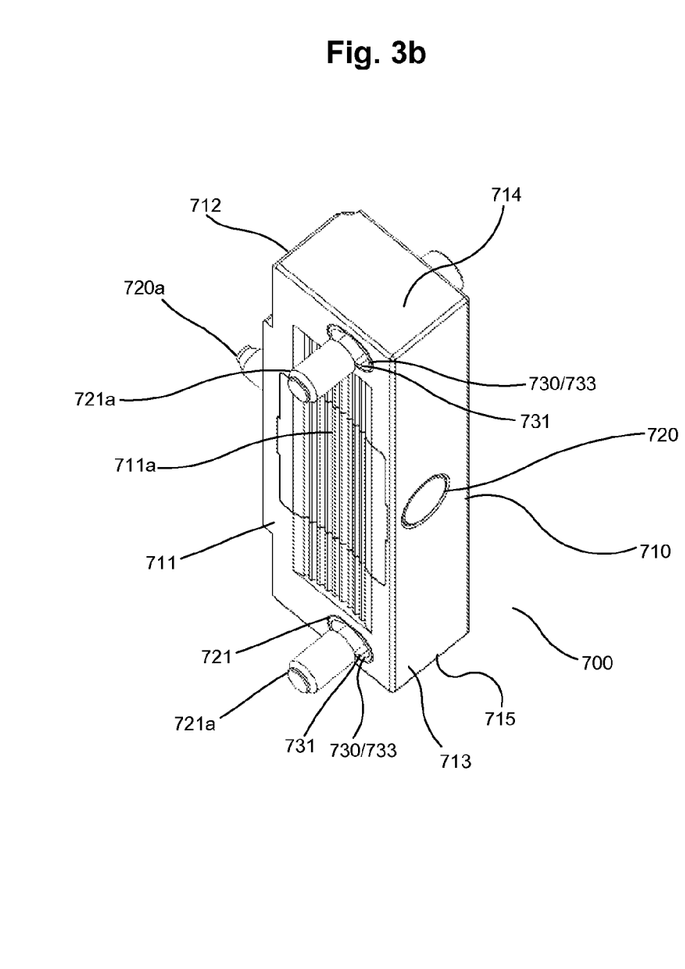
FIG. 3b is a perspective view of the fastening device of FIG. 3a from another angle.
Figure 3C:
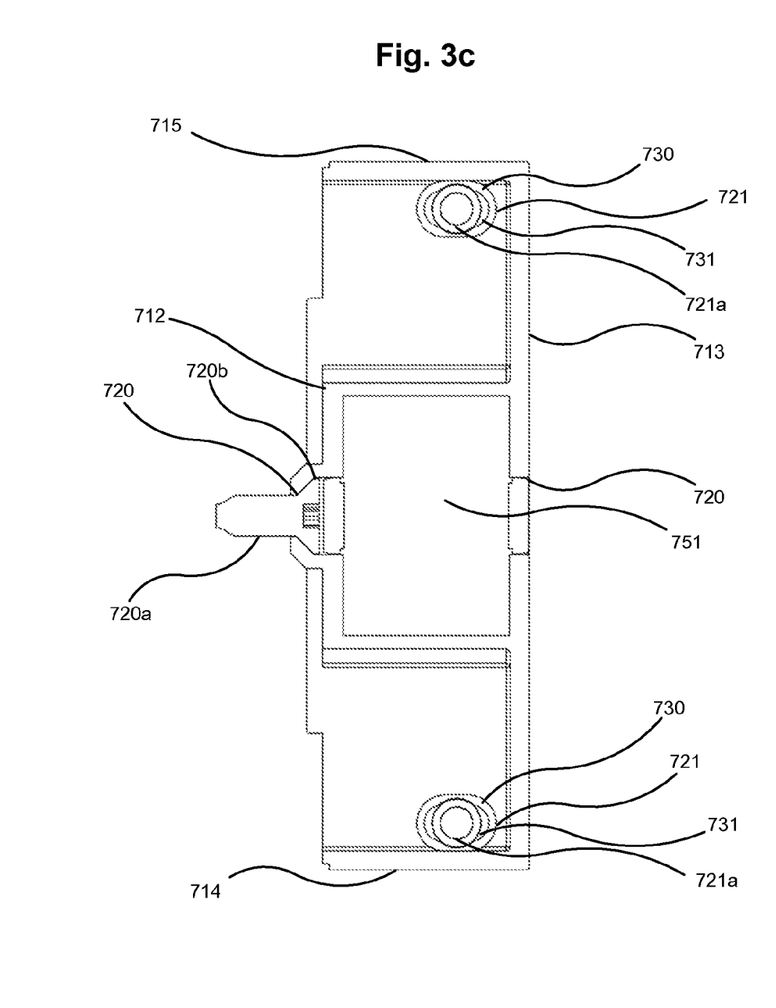
FIG. 3c is a cross-sectional view of the fastening device of FIG. 3a as viewed from K along a section L.
Figure 3D:
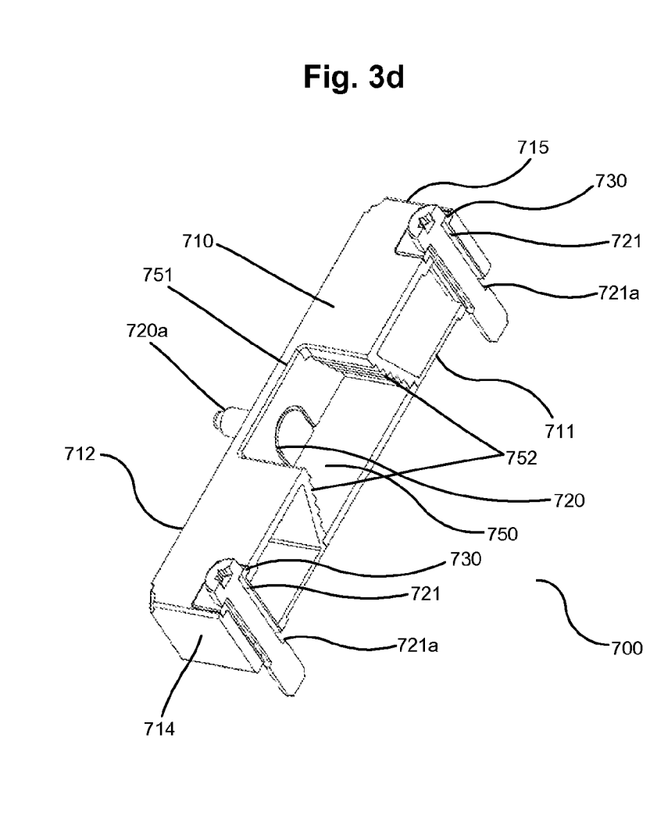
FIG. 3d is a partly removed perspective view of a cross-section of the fastening device of FIG. 3a as viewed from P along a section Q.
Figure 4A:
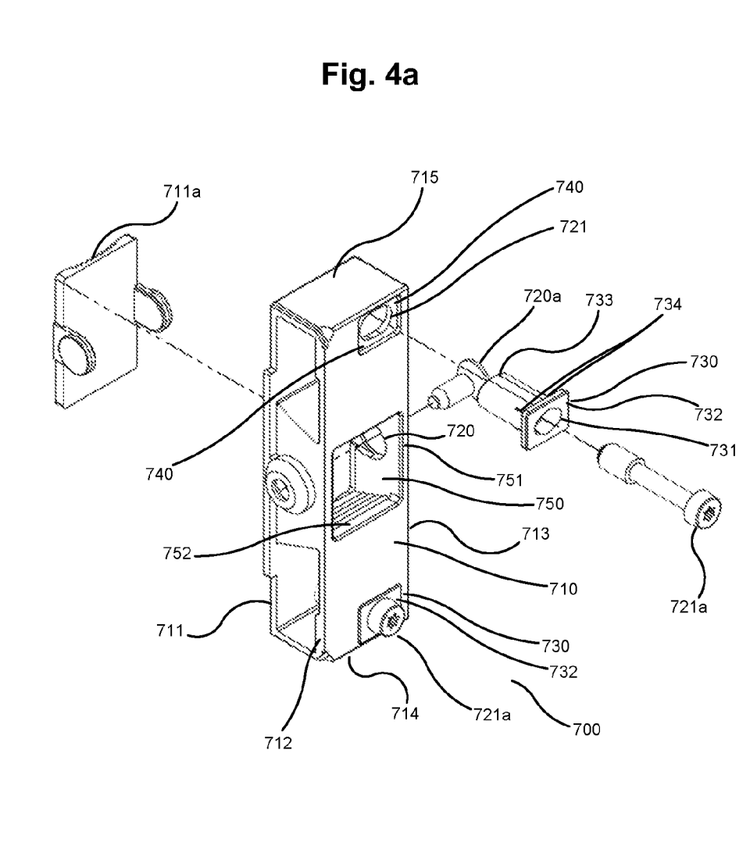
Figure 4B:
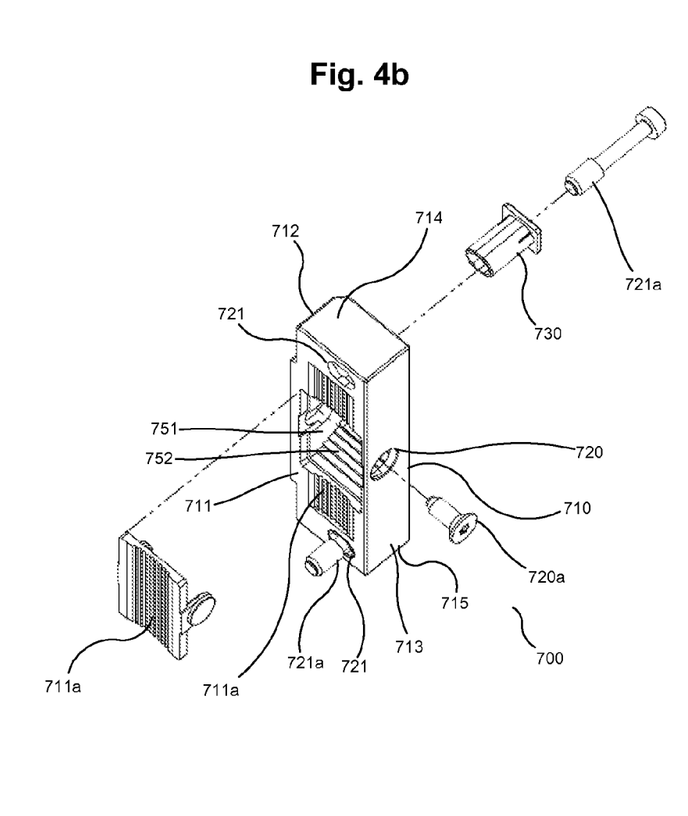
FIG. 4b is an exploded perspective view of the fastening device of FIG. 4a from another angle.

According to a preferred embodiment, illustrated in FIGS. 3*a*-4*b*, the fastening device 700 comprises a cavity 750 between the front face 710 and the rear face 711, which cavity in turn comprises an opening 751 out into the surroundings. The cavity is preferably arranged with engagement means 752, arranged for engagement with a certain predetermined tool in turn arranged to be inserted into the opening and in the cavity engaging with the engagement means. According to an alternative and very preferred embodiment, the engagement means 752 are arranged as gripping means intended for one or several fingers of a user. In this case, the engagement means are for instance composed by one or several oblique surfaces, preferably arranged with friction corrugations, as illustrated in FIGS. 3*a* and 3*d*.

Using the engagement means and the tool, alternatively fingers, a user may, by aid of the engagement means 752 in the respective fastening devices 700, 790, pull the cover 200 out some ways from its position in the rack system 100 when the fastening of the fastening device 700 to the stand 101 has been loosened. Thereafter, the user can grip around the respective fastening devices as such, using his hands, and use them as handles for complete removal and further handling of the cover 200.

During such direct contacting between the user and fastening device 700, 720, there is, as described above, no risk of electrostatic discharges disturbing the components in the cover 200, since such discharges can be conducted to the stand from the fastening means.

It is preferred that the opening 751 is arranged on the front face 710 of the fastening means, as illustrated in the figures, but it may also be arranged on the top face 715, bottom face 714 and/or the face 713 facing away from the cover 200, of the fastening device. Several openings can also be arranged on the same face, which is illustrated in the cover 202 in FIG. 1. In case several openings are arranged on the fastening device for alternative grips, it is preferred that all openings open out into the same cavity 750 in the fastening device.

Furthermore, it is preferred that the first through hole 720 opens out into the cavity 750, preferably so that the through hole 720 runs from one of the sides 712, straight through the cavity and out through the other side 713 of the fastening device 700. In this case, the cavity comprises a counterstay, for example in the form of the countersink 720b, for the fastening means 720a, which fastening means preferably is in the form of a screw, arranged to be inserted through the first hole 720 and to fasten the fastening device 700 at the cover 200. Further, the cavity is designed so that a tool, such as a screw driver, can be inserted into the cavity and therein guarantee fastening of the fastening means, for example by tightening the screw, so that the fastening device is thereby fixed to the stand. Such a construction admits a design of the fastening device with no visible fastening means on its face 713. Moreover, the fastening means can be tightened very hard against the counterstay with no risk of the fastening device undergoing undesirable material deformations.

According to a preferred embodiment, the fastening of the fastening device 700 to the side 230 of the cover 200 is so arranged, in terms of strength, so that the cover, when not mounted in the rack system 100, can be lifted by the user first gripping around the fastening device and thereafter using the fastening device as a handle for lifting the cover when oriented with its front face 260 upwards. This admits that the cover can be handled in an ergonomically correct way even if its weight is considerable.

In order to gain an ergonomically correct and stable grip of the fastening device 700, there are preferably arranged gripping means 711a arranged on the rear side 711 of the fastening device.

Furthermore, it is preferred that the fastening device 700 is arranged so that its front face 710 is arranged not to protrude further than the front face 260 of the cover 200 when the fastening device is mounted in its place at the side 230 of the cover. Such design admits that the front face of the cover, which often comprises a display, check control and/or control means, and so on, is freely viewable even from oblique viewing angles, preferably across viewing angles of essentially 180 degrees, without being obscured from the side by the fastening device.

According to an especially preferred embodiment, the fastening device 700 is made from aluminum, preferably by press casting. In addition to the manufacturing being relatively inexpensive, this results in that the electric conductivity through the material of the fastening device will be very good, and therefore also the electric contacting. In this case, it is preferred to use distance means 730 and/or countersunk counterstays 720b according to the above for both the first 720a and the second 721a fastening means. Consequently, the main body of the fastening device can be manufactured from aluminum without risking material deformations during tightening of the fastening means.

It is preferred for both the fastening means 720a, 721a to each be stainless steel, preferably self-tapping, screws. This admits a mechanically as well as electrically secure connection between stand 101 and cover 200, respectively.

Above, preferred embodiments have been described. However, it is apparent to the skilled person that many modifications may be made to the described embodiments without departing from the idea of the invention.

For example, one or several of the second through holes 721 may be arranged with a countersink 720b, and/or one or several of the first through hole or holes may be arranged with a distance means 730 according to the above. Distance means can also be combined with countersinks, which in such cases replace the above described abutment surface on the surface of the shoulder.

It is also possible to use other types of fastening means than screws, such as for example a lever connected to a strap jointing arranged to press the fastening device to the cover and/or to the stand, as long as good electric contacting on the one hand between screw and fastening device and on the other hand between screw and cover and stand, respectively, can be achieved.

Thus, the invention shall not be limited to the described embodiments, but can be varied within the scope of the enclosed claims.

The invention claimed is:

1. Cover (200) for electronic equipment, which cover is intended for mounting in a rack system (100), following the standard for 19 inch racks, comprising a stand (101), wherein the cover comprises a fastening device (700) comprising a front face (710), which is arranged to be oriented facing out from the rack system when the fastening device is mounted on the cover and the cover is mounted in the rack system, a rear face (711) arranged opposite to the front face, two opposing side faces (712,713), as well as a bottom (714) and a top (715) face, wherein the fastening device is arranged to, using a first fastening means (720a), be fixedly connected to the cover at one of its side faces, extending a certain distance out from the side face (230) of the cover, and fastened, using a second fastening means (721a), to the stand so that the rear face of the fastening device is arranged oriented facing towards the stand, whereby the cover can be fixed to the stand, wherein the fastening device comprises a cavity (750), arranged between the front face and the rear face and comprising an opening (751), and in that the cavity is arranged with gripping means (752) for one or several fingers, so that a user can insert one or several fingers through the opening and pull the cover out from its place in the rack system using the gripping means once the fastening device has been unfastened from the stand.

2. Cover (200) according to claim 1, wherein the opening (751) is arranged on the front face (710) of the fastening device (700).

3. Cover (200) according to claim 1, wherein the fastening to the side (230) of the cover (200) of the fastening device (700) is arranged so that the cover can be lifted by the user first gripping around the fastening device and thereafter using the fastening device as a handle to lift the cover when it is oriented with its front face (260) up.

4. Cover (200) according to claim 3, wherein the rear face of the fastening device (700) comprises gripping means (711a) for the fingers of a user.

5. Cover (200) according to claim 1, wherein the front face of the fastening device (700) is arranged not to protrude further out than the front face (260) of the cover (200) when the fastening device is mounted on the cover.

6. Cover (200) according to claim 1, wherein the fastening device (700) comprises a first through hole (720), extending from one (712) of the side faces to the other (713) side face, for fastening the fastening device to the side of the cover, as well as an additional, second through hole (721), extending from the front face to the back face, for fastening the fastening device to the stand, and in that the fastening device is made from an electrically conducting material.

7. Cover (200) according to claim 6, wherein the first through hole (720) opens out into the cavity (750), in that the cavity comprises a counterstay (720*b*) for a screw (720*a*) which is arranged to be inserted through the first through hole and fastening the fastening device (700) to the cover (200), and in that the cavity is arranged so that a tool such as a screw driver can be inserted into the cavity and therein tighten the screw so that the fastening device is fixed to the cover.

8. Cover (200) according to claim 6, wherein the fastening device (700) comprises a metal distance means (730), arranged to run through the first (720) and/or second (721) hole, in that the distance means is arranged with a through hole (731) which is arranged to run in parallel with and within the said first and/or second through hole when the distance means is mounted in the first and/or second through hole, and in that the distance means comprises a shoulder (732) which is arranged to abut against a corresponding support surface (740) of the fastening device when the distance means is mounted in the first and/or second through hole so that the shoulder prevents the distance means to be displaced in a direction towards the rear face (711) of the fastening device and/or the face (713) of the fastening device facing away from the cover.

9. Cover (200) according to claim 8, wherein the distance means (730) is arranged with sharp, exterior grooves (734) or corresponding engagement means, that during assembly of the distance means in the first (720) and/or second (721) through hole is arranged to engage, and give rise to good electric contacting, with the material at the inside of the said first and/or second through hole.

10. Cover (200) according to claim 8, wherein the distance means (730) is arranged with internal threads for engagement with a screw (721*a*) for fastening the fastening device (700) to the stand (101) and/or the cover (200), and in that the screw is of so called "non-losable" type, that is a screw which is arranged to be unscrewed, during unscrewing from a mounted position in a first step, so that the fastening comes loose, whereby the screw is retained loosely in the screw hole, and that the screw thereafter, in a second step, can be unscrewed further a certain distance after which it can be completely removed.

11. Cover (200) according to claim 8, wherein the distance means (700) is arranged to run through the second through hole (721).

12. Cover (200) according to claim 1, wherein the cover (200) comprises two said fastening devices (700,790), intended to be mounted on either side (230;240) of the cover on either side of the front face (260) of the cover.

* * * * *